(12) United States Patent
Suenaga

(10) Patent No.: US 10,333,051 B2
(45) Date of Patent: Jun. 25, 2019

(54) PIEZOELECTRIC ELEMENT, AND ACOUSTIC GENERATOR, ACOUSTIC GENERATION DEVICE, AND ELECTRONIC APPARATUS EMPLOYING SAME

(71) Applicant: KYOCERA Corporation, Kyoto-shi, Kyoto (JP)

(72) Inventor: Hiroshi Suenaga, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 284 days.

(21) Appl. No.: 15/319,070

(22) PCT Filed: Apr. 27, 2015

(86) PCT No.: PCT/JP2015/062709
§ 371 (c)(1),
(2) Date: Dec. 15, 2016

(87) PCT Pub. No.: WO2016/031302
PCT Pub. Date: Mar. 3, 2016

(65) Prior Publication Data
US 2017/0133578 A1    May 11, 2017

(30) Foreign Application Priority Data

Aug. 28, 2014  (JP) ................................ 2014-174101

(51) Int. Cl.
*H01L 41/047* (2006.01)
*H01L 41/083* (2006.01)
(Continued)

(52) U.S. Cl.
CPC ........ *H01L 41/0471* (2013.01); *B06B 1/0611* (2013.01); *B06B 1/0644* (2013.01);
(Continued)

(58) Field of Classification Search
CPC ............ H01L 41/0471; H01L 41/0472; H01L 41/083; H01L 41/0833; B06B 1/0611; B06B 1/0644
See application file for complete search history.

(56) References Cited

U.S. PATENT DOCUMENTS

2006/0125354 A1*  6/2006  Boecking ............ H01L 41/0833
                                                            310/367
2007/0030625 A1*  2/2007  Aoki ........................ H01G 4/30
                                                            361/303
(Continued)

FOREIGN PATENT DOCUMENTS

CN       103828393 A      5/2014
DE    102009001090 A1     8/2009
(Continued)

OTHER PUBLICATIONS

Partial Supplementary European Search Report, European Application No. 15835292.2, dated Feb. 13, 2018, 15 pgs.

*Primary Examiner* — Bryan P Gordon
(74) *Attorney, Agent, or Firm* — Volpe and Koenig, P.C.

(57) ABSTRACT

There is provided a piezoelectric element in which dielectric breakdown or breakage is less prone to occur even in long term use at a high voltage; and an acoustic generator, an acoustic generation device, and an electronic apparatus employing the same. A piezoelectric element includes: a stacked body in which a plurality of internal electrodes and piezoelectric layers are laminated, the stacked body having a rectangular shape in a plan view thereof; and a plurality of connecting electrodes connected to one ends of the plurality of internal electrodes, respectively, corner portions of the other ends of the plurality of internal electrodes being chamfered.

11 Claims, 11 Drawing Sheets

(51) Int. Cl.
*B06B 1/06* (2006.01)
*H04R 17/00* (2006.01)

(52) U.S. Cl.
CPC ........ *H01L 41/0472* (2013.01); *H01L 41/083* (2013.01); *H01L 41/0833* (2013.01); *H04R 17/005* (2013.01)

(56) References Cited

U.S. PATENT DOCUMENTS

| | | |
|---|---|---|
| 2007/0216265 A1 | 9/2007 | Cooke et al. |
| 2007/0278907 A1* | 12/2007 | Kondo ................ H01L 41/0471 310/364 |
| 2009/0224636 A1 | 9/2009 | Kondo et al. |
| 2010/0156250 A1 | 6/2010 | Kondo et al. |
| 2011/0155822 A1* | 6/2011 | Sata ...................... H01L 41/273 239/102.2 |
| 2013/0342083 A1* | 12/2013 | Schmidt .............. H01L 41/0472 310/366 |
| 2014/0265729 A1* | 9/2014 | Murakami ............ C04B 35/495 310/323.02 |
| 2015/0125009 A1 | 5/2015 | Kamitani et al. |

FOREIGN PATENT DOCUMENTS

| | | |
|---|---|---|
| EP | 1814170 A2 | 8/2007 |
| JP | 08-274381 A | 10/1996 |
| JP | 2013-162141 A | 8/2013 |
| JP | 2014-011340 A | 1/2014 |
| WO | 2005/086247 A1 | 9/2005 |
| WO | 2014/045645 A1 | 3/2014 |

* cited by examiner

PIEZOELECTRIC ELEMENT, AND ACOUSTIC GENERATOR, ACOUSTIC GENERATION DEVICE, AND ELECTRONIC APPARATUS EMPLOYING SAME

TECHNICAL FIELD

The present invention relates to: a piezoelectric element especially suitable for generating acoustic sound; and an acoustic generator, an acoustic generation device, and an electronic apparatus employing the piezoelectric element.

BACKGROUND ART

As an acoustic generator, an acoustic generator in which a piezoelectric element having a rectangular plate shape is employed so that size reduction is achieved is known (e.g., see Patent Literature 1).

CITATION LIST

Patent Literature

Patent Literature 1: Japanese Unexamined Patent Publication JP-A 2013-162141

SUMMARY OF INVENTION

Technical Problem

Nevertheless, with the progress of size reduction in the acoustic generator, a decrease in the sound pressure, especially, a sound pressure decrease in a low frequency range at or below 2 kHz, becomes remarkable.

For the purpose of improvement of the sound pressure in this frequency range, it is sufficient that the voltage applied on the acoustic generator is increased. Nevertheless, when the acoustic generator is used for a long term in a state where a high voltage is applied, a possibility is caused that dielectric breakdown occurs in the piezoelectric layer located in the corner portions of the internal electrode of the piezoelectric element where the electric charge is especially concentrated. Further, a possibility is caused that cracks occur in the corner portions of the internal electrode of the piezoelectric element where the electric charge is concentrated, so that a problem of breakage of the piezoelectric element is caused.

The invention has been devised in view of such problems. An object thereof is to provide a piezoelectric element in which dielectric breakdown or breakage is less prone to occur even in long term use at a high voltage; and an acoustic generator, an acoustic generation device, and an electronic apparatus employing the same.

Solution to Problem

A piezoelectric element according to an embodiment of the invention includes: a stacked body in which a plurality of internal electrodes and piezoelectric layers are laminated, the stacked body having a rectangular shape in a plan view thereof; and a plurality of connecting electrodes connected to one ends of the plurality of internal electrodes, respectively, corner portions of the other ends of the plurality of internal electrodes being chamfered.

Further, an acoustic generator according to an embodiment of the invention includes: the piezoelectric element configured as mentioned above; a vibration plate to which the piezoelectric element is attached, the vibration plate vibrating in association with vibration of the piezoelectric element; and a supporting body disposed in at least a part of an outer periphery of the vibration plate so as to support the vibration plate.

Further, an acoustic generation device according to an embodiment of the invention includes: the acoustic generator configured as mentioned above; and a housing which contains the acoustic generator.

Further, an electronic apparatus according to an embodiment of the invention includes: the acoustic generator configured as mentioned above; an electronic circuit connected to the acoustic generator; and a housing which contains the electronic circuit and the acoustic generator, the electronic apparatus having a function of generating acoustic sound through the acoustic generator.

Advantageous Effects of Invention

According to the invention, a piezoelectric element can be obtained in which dielectric breakdown or breakage is less prone to occur even in long term use at a high voltage. Further, when the piezoelectric element is employed, an acoustic generator, an acoustic generation device, and an electronic apparatus can be obtained in which size reduction is achieved and a high reliability is obtained.

DESCRIPTION OF EMBODIMENTS

An example of a piezoelectric element of the present embodiment is described below in detail with reference to the accompanying drawings. Here, the invention is not limited by the embodiment given below.

FIG. 1(a) is a schematic perspective view showing an example of a piezoelectric element of the present embodiment. FIG. 1(b) is a sectional view taken along line A-A in FIG. 1(a). FIG. 1(c) is a perspective plan view showing an internal electrode pattern of the piezoelectric element shown in FIG. 1(a).

Figure 1:
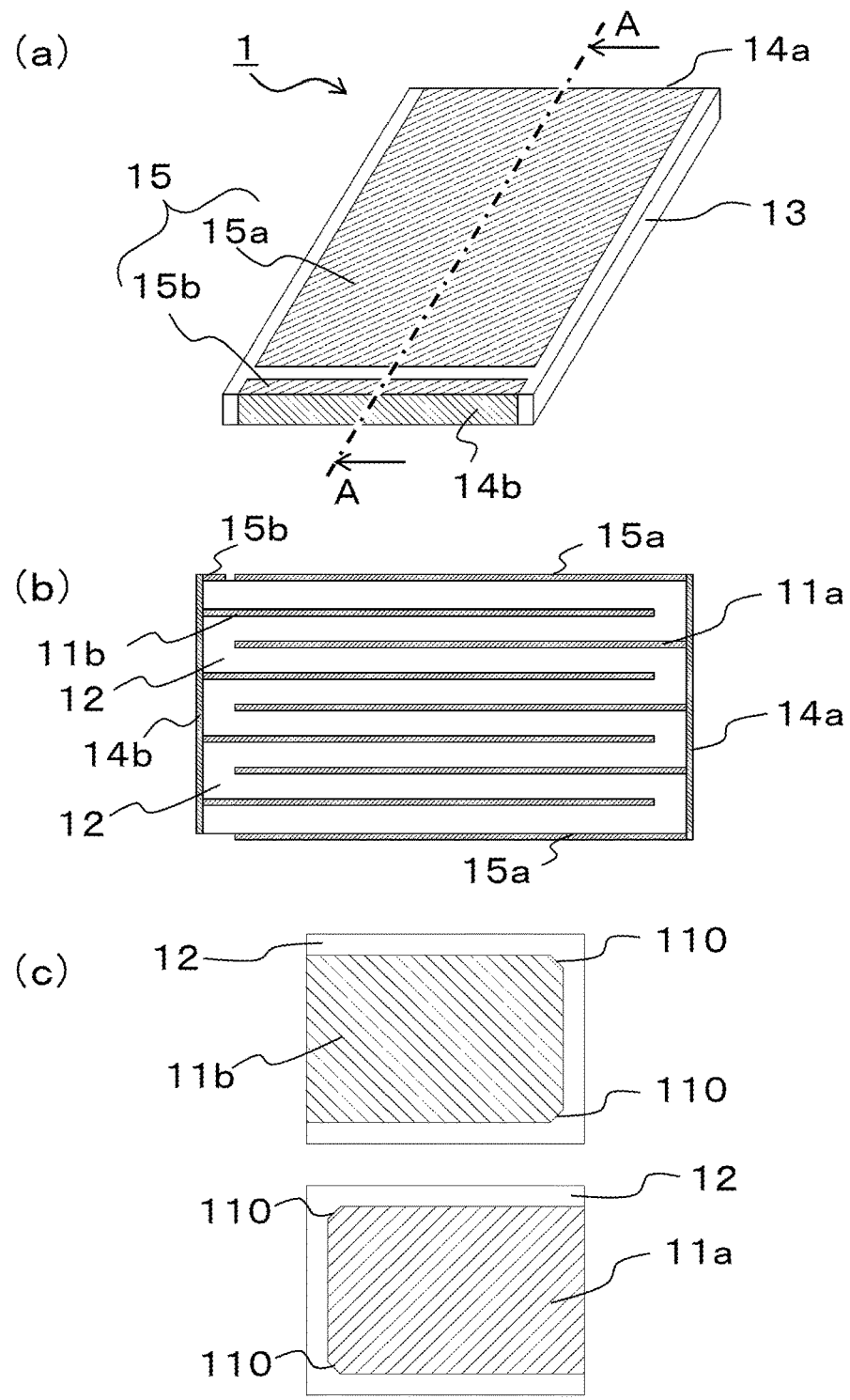
FIG. 1(a) is a schematic perspective view showing an example of a piezoelectric element of the present embodiment.
FIG. 1(b) is a sectional view taken along line A-A in FIG. 1(a)
FIG. 1(c) is a partly-omitted exploded sectional view of the piezoelectric element shown in FIG. 1(a), taken along a plane containing each internal electrode.

The piezoelectric element 1 of the present embodiment shown in FIG. 1 includes: a stacked body 13 in which a plurality of internal electrodes 11 and piezoelectric layers 12 are laminated, the stacked body 13 having a rectangular shape in plan view thereof; a plurality of connecting electrodes 14a and 14b connected to one ends of the plurality of internal electrodes 11, respectively; and surface electrodes 15 electrically connected through the connecting electrodes 14a and 14b to the plurality of internal electrodes 11, respectively. Then, corner portions 110 of the other ends of the plurality of internal electrodes 11 are chamfered. Here, the chamfered configuration mentioned here may be implemented by cutting off the corners in the other end of the internal electrode 11 or, alternatively, by forming the internal electrode 11 in a shape that the corner portions are chamfered.

The stacked body 13 is a plate-shaped member whose principal surface shape in a plan (upper face) view thereof is rectangular. The plurality of internal electrodes 11 constituting the stacked body 13 are laminated alternately with the plurality of piezoelectric layers 12. Further, the internal electrodes 11 shown in FIG. 1 include first internal electrodes 11a and second internal electrodes 11b provided alternately. Then, the first internal electrodes 11a and the second internal electrodes 11b are individually led out to different side faces of the stacked body 13. The first internal electrodes 11a and the second internal electrodes 11b shown in FIG. 1 are each formed in a rectangular shape apart from the shapes of the corner portions 110 described later. For example, materials employable for these electrodes include: a conductor composed mainly of silver or silver-palladium capable of being manufactured by low temperature firing; and a conductor containing copper, platinum, or the like. Further, a ceramic component or a glass component may be contained in these materials.

The plurality of piezoelectric layers 12 constituting the stacked body 13 are formed of ceramics having a piezoelectric property. Examples of ceramics employable for this layer include: a perovskite type oxide composed of lead zirconate titanate ($PbZrO_3$—$PbTiO_3$); lithium niobate ($LiNbO_3$); and lithium tantalate ($LiTaO_3$). For the purpose of achieving low voltage drive, for example, it is preferable that the thickness of the single piezoelectric layer 12 is set to be 0.01 to 0.1 mm or the like. Further, for the purpose of obtaining large flexural vibration, it is preferable that the employed material has a piezoelectric constant d31 of 200 pm/V or higher.

Further, the stacked body 13 shown in FIG. 1 includes: a first surface electrode 15a electrically connected to the first internal electrodes 11a; and a second surface electrode 15b electrically connected to the second internal electrodes 11b. Each surface electrode 15 is provided on at least one principal surface of the stacked body 13. In the example shown in FIG. 1, the first surface electrode 15a is provided on both principal surfaces of the stacked body 13 and the second surface electrode 15b is provided on one principal surface (the upper principal surface) alone of the stacked body 13. Since the first surface electrode 15a is provided on the principal surface, the outermost piezoelectric layer 12 of the stacked body 13 is located between the internal electrode 11b and the first surface electrode 15a. Thus, when a driving voltage is applied on the outermost piezoelectric layer 12, the outermost piezoelectric layer 12 can contribute to the vibration of the piezoelectric element. Employable forming materials for the surface electrodes include: silver; a silver compound containing silica-based glass or the like in silver; and nickel.

Further, the stacked body 13 is provided with the connecting electrodes 14a and 14b which connect every other layer of one ends of the plurality of internal electrodes 11, respectively. Specifically, the stacked body 13 includes: the first connecting electrode 14a which electrically connects the first internal electrodes 11a and the first surface electrode 15a; and the second connecting electrode 14b which electrically connects the second internal electrodes 11b and the second surface electrode 15b. Here, in the following description, description common to the individual connecting electrodes 14a and 14b is made simply with using a term "the connecting electrode 14", in some cases. In FIG. 1, the connecting electrode 14 (the first connecting electrode 14a or the second connecting electrode 14b) is provided on each side face of the stacked body 13, more specifically, on each of the end faces opposite to each other in the stacked body 13 having a rectangular plate shape. Employable forming materials for the connecting electrode 14, similarly to those of the surface electrode 15, include: silver; a silver compound containing silica-based glass or the like in silver; and nickel.

Here, in FIG. 1, the connecting electrode 14 which electrically connects the surface electrode 15 and the internal electrodes 11 is a side face electrode formed on the side face (the end face) of the stacked body 13. In place of the side face electrode, the connecting electrode 14 may be a penetration conductor going through the one ends of the internal electrodes 11 and the piezoelectric layers 12. At that time, in order that the penetration conductor electrically connected to the first internal electrodes 11a is not electrically connected to the second internal electrodes 11b, it is sufficient that a desired gap is provided between the other ends of the second internal electrodes 11b and the end face of the stacked body 13.

Then, the corner portions 110 of the other ends of the plurality of internal electrodes 11 (the plurality of first internal electrodes 11a or the plurality of second internal electrodes 11b) are chamfered. Here, the first internal electrodes 11a and the second internal electrodes 11b are alternately laminated and then individually led out to the different side faces opposite to each other. Then, the ends on the leading-out side are referred to as the one ends of the first internal electrodes 11a and the second internal electrodes 11b. That is, the other ends of the plurality of internal electrodes 11 indicate the ends on a side opposite to the side where the internal electrodes 11 are led out. Further, the expression "the corner portions 110 are chamfered" indicates that the corner portions 110 have inclined shapes or rounded shapes. Here, the corner portions 110, which are chamfered, are referred to as corner portions for convenience in the following description.

Since the corner portions 110 of the other ends of the plurality of internal electrodes 11 are chamfered, concentration of the electric charge to the corner portions of the internal electrodes 11 at the time of high voltage application can be dispersed and hence dielectric breakdown in the piezoelectric layers 12 can be suppressed. Further, deformation of the piezoelectric layers 12 in association with the high voltage application causes concentration of a high stress on the piezoelectric layers 12. However, the chamfering of the corner portions 110 of the internal electrodes 11 can disperse the stress and hence breakage of the piezoelectric layers 12 caused by crack occurrence can be suppressed.

For example, the distance of chamfering (the distance between the virtual corner point having been present before chamfering and the start point of chamfering) is set to be 300 to 3000 μm.

Figure 2:
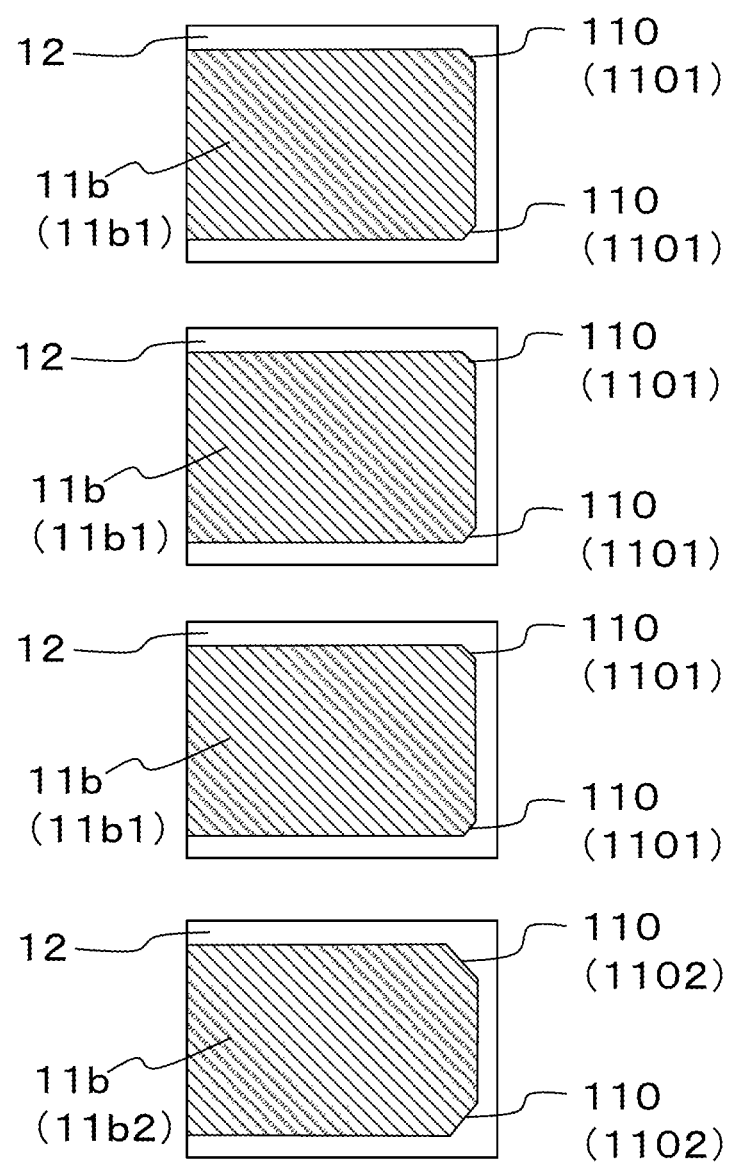
FIG. 2 is an exploded sectional view of another example of the piezoelectric element of the present embodiment, taken along a plane containing each internal electrode.

Here, it is preferable that at least one internal electrode 11 among the plurality of internal electrodes 11 has a chamfered corner portion 110 whose size is different from sizes of chamfered corner portions of the other internal electrodes 11. In the example shown in FIG. 2, a size of the chamfered corner portion 1102 of one second internal electrode 11b2 among the plurality of second internal electrodes 11b is larger than a size of the chamfered corner portion 1101 of the other second internal electrodes 11b1. Here, for example, the distance of the chamfered corner portion 1102 having a size different from those of the other corner portions 1101 (the distance between the virtual corner point having been present before chamfering and the start point of chamfering) is set to be 1.1 to 1.5 times the distance of each of the other corner portions 1101.

When such a configuration is employed, the balance of piezoelectric resonance is broken down so that spurious vibration occurs in addition to the principal vibration. This causes damping or dispersion in the principal vibration. Thus, when the piezoelectric element is employed in an acoustic generator, peak/dip can be reduced in the frequency-sound pressure characteristics so that flattening is achieved and the sound quality can be improved.

Figure 3:
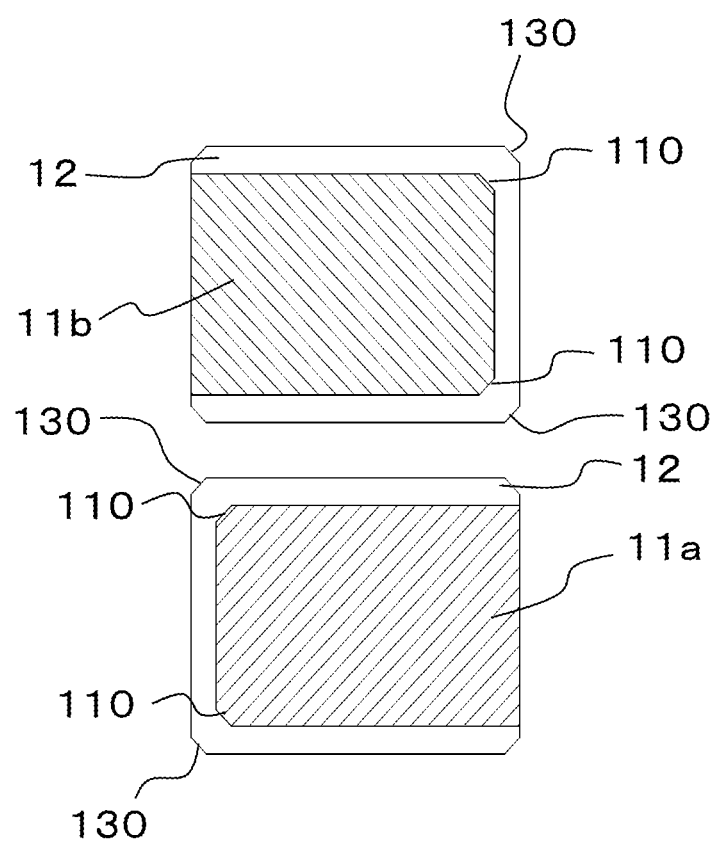
FIG. 3 is a partly-omitted exploded sectional view of still another example of the piezoelectric element of the present embodiment, taken along a plane containing each internal electrode.

Here, as shown in FIG. 3, in the piezoelectric element 1 of the present example, it is preferable that the edge portions 130 of the stacked body 13 close to the chamfered corner portions 110 of the internal electrodes 11 are chamfered. Here, the expression "being chamfered" indicates that each edge portion 130 is formed in a curved face (an R face) or an inclined face (a C face). Such a surface may be obtained by chamfering work or by forming the stacked body in a chamfered shape. Here, for example, when the edge portion 130 is in the form of a curved face (an R face), the radius of curvature is set to be 100 to 1000 μm. In the case of an inclined face (a C face), the distance of chamfering (the distance from the virtual corner point having been present before chamfering to the start point of chamfering) is set to be 100 to 1000 μm.

Since the corner portions 110 of the internal electrodes 11 are chamfered, a sufficient distance can be ensured between the corner portions 110 of the internal electrodes 11 and each edge portion 130 of the stacked body 13 even when the edge portions 130 in the stacking direction of the stacked body 13 are chamfered. Further, since the edge portions 130 in the stacking direction of the stacked body 13 close to the chamfered corner portions 110 of the internal electrodes 11 are chamfered, an impact or a stress acting on the edge portions 130 of the piezoelectric element 1 in association with processing or handling can be are dispersed and hence breakage of the piezoelectric element 1 can be suppressed.

Figure 4A:
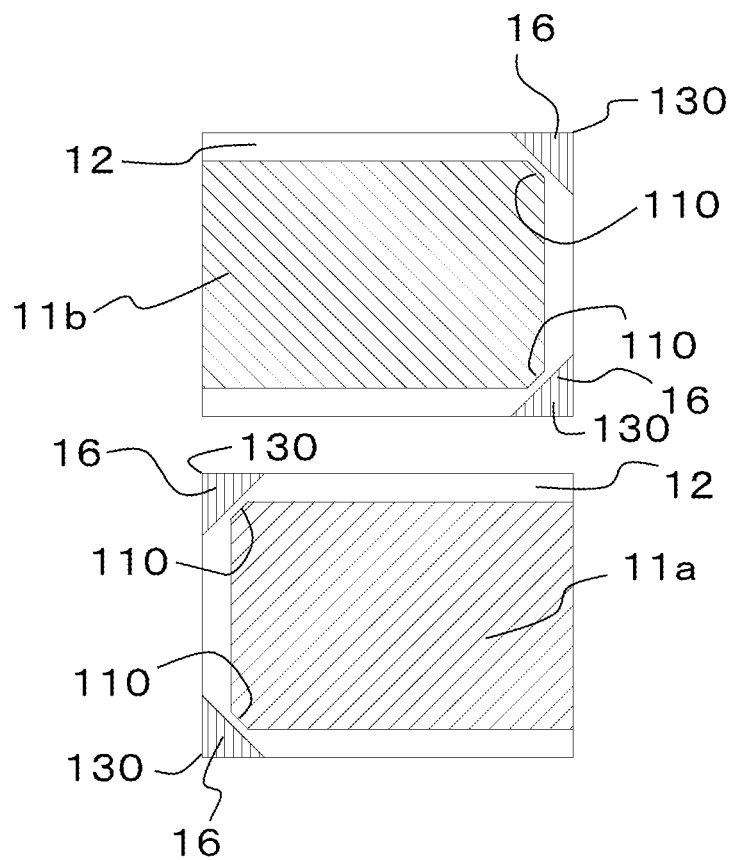
FIG. 4A is a partly-omitted exploded sectional view of still another example of the piezoelectric element of the present embodiment, taken along a plane containing each internal electrode.

Further, as shown in FIG. 4A, in the piezoelectric element 1 of the present example, it is preferable that a conductor layer 16 is disposed between each chamfered corner portion 110 of the internal electrodes 11 and each edge portion 130 in the stacking direction of the stacked body 13 close to the corner portion 110 between the piezoelectric layers 12 where the internal electrode 11 provided with the chamfered corner portions 110 is provided.

The deformation of the piezoelectric layers 12 (active part) in association with the high voltage application causes a high stress in the corner portions of the piezoelectric layer 12. Then, this stress induces space charge polarization in the grain boundary in the piezoelectric layer 12 and thereby causes a tendency of fluctuation in the piezoelectric property. In contrast, when the conductor layer 16 is disposed between the chamfered corner portion 110 and the edge portion 130 in the stacking direction of the stacked body 13 close to the corner portion 110, the electric charge easily moves along the grain boundary by virtue of a potential difference between the chamfered corner portion 110 of the internal electrode 11 and the conductor layer 16. Thus, the electric charge generated in the grain boundary in the corner portion of the piezoelectric layer 12 can be released to the outside and hence the space charge polarization generated in the grain boundary can be suppressed. Accordingly, a polarization fluctuation cause by the high voltage application can be reduced so that a fluctuation in the piezoelectric property can be suppressed.

Here, for example, the gap between the internal electrode 11 and the conductor layer 16 is set to be 200 to 1000 μm. In addition to a triangle in plan view as shown in the figure, the shape of the conductor layer 16 may be a rectangle, an ellipse, or any other shapes. However, a shape having a portion parallel to the chamfering of the internal electrode 11 is effective. Further, a shape reaching the edge portion 130 of the stacked body 13 is effective.

Here, although not shown in the figure, a configuration may be employed that the edge portion 130 is chamfered and the conductor layer 16 is provided.

Figure 5:
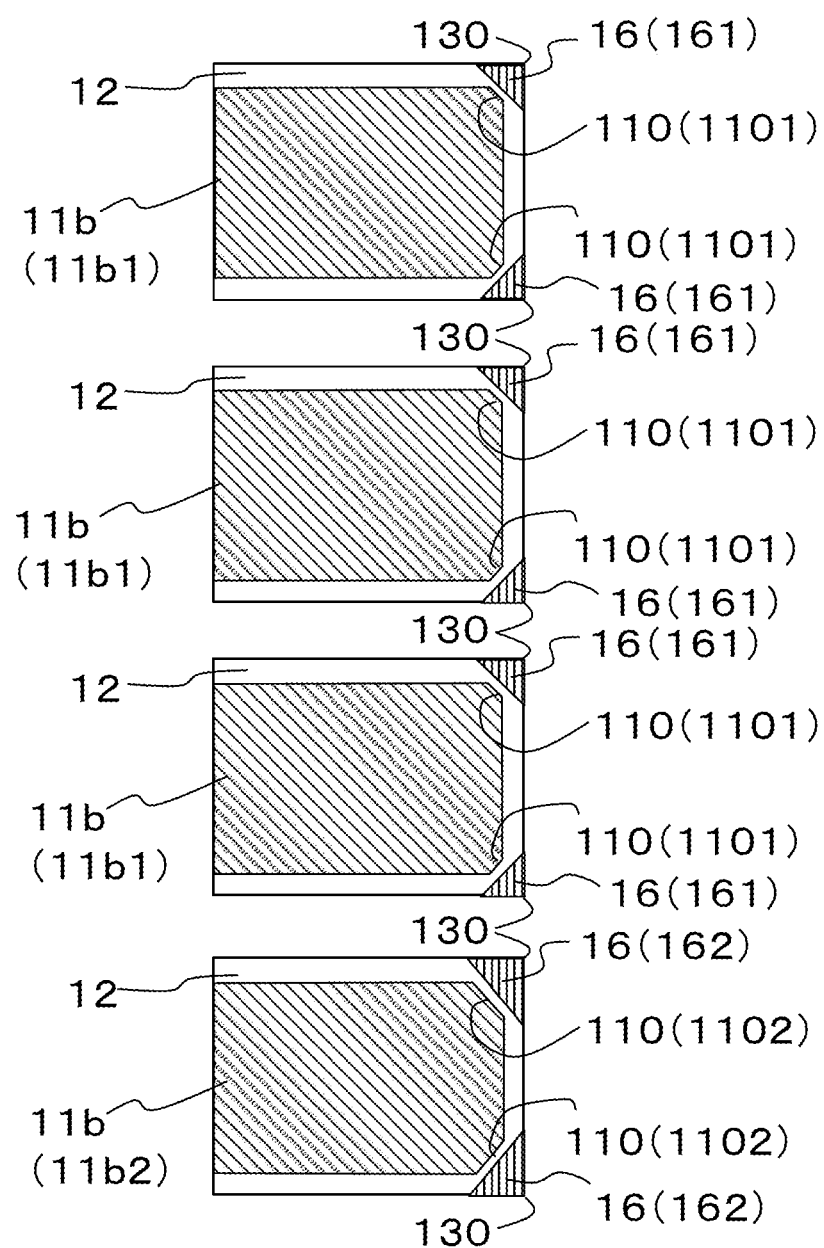
FIG. 5 is an exploded sectional view of still another example of the piezoelectric element of the present embodiment, taken along a plane containing each internal electrode.

Here, at least one conductor layer 16 among the plurality of conductor layers 16 may have a larger area than the other conductor layers 16. In the example shown in FIG. 5, the area of one conductor layer 162 among the plurality of conductor layers 16 is larger than the area of each of the other conductor layers 161. Here, for example, the distance from the edge portion 130 of the conductor layer 162 having a size different from those of the other conductor layers 16 is set to be 1.1 to 1.5 times the distance of each of the other conductor layers 16.

According to this configuration, in addition to the above-mentioned sound quality improvement effect obtained by the configuration that at least one internal electrode 11 among the plurality of internal electrodes 11 has a chamfered corner portion 110 whose size is different from sizes of chamfered corner portions of the other internal electrodes 11, a fluctuation in the piezoelectric property can also be suppressed.

Further, the piezoelectric element shown in FIG. 1 is of so-called unimorph structure. Instead, a piezoelectric element 2 of so-called bimorph structure shown in FIG. 6 may be employed.

Figure 6:
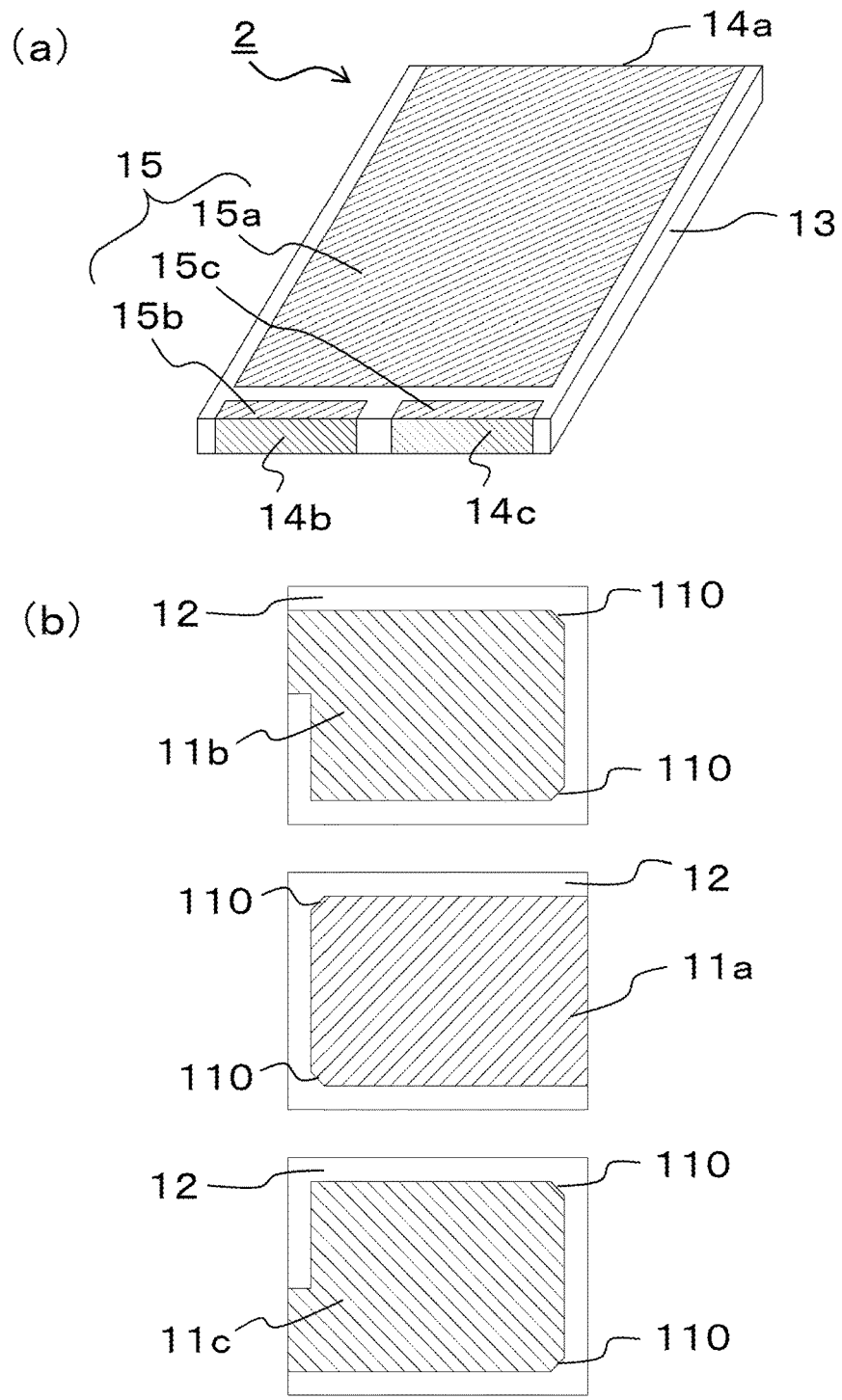
FIG. 6(a) is a schematic perspective view showing yet another example of the piezoelectric element of the present embodiment.
FIG. 6(b) is a partly-omitted exploded sectional view of the piezoelectric element shown in FIG. 6(a), taken along a plane containing each internal electrode.

The piezoelectric element 2 shown in FIG. 6 includes as internal electrodes 11: first internal electrodes 11a disposed every other layer; second internal electrodes 11b arranged in a region on the one principal surface side of the stacked body 13 and disposed every other layer such as to oppose the first internal electrode 11a with the piezoelectric layer 12 in between; and third internal electrodes 11c arranged in a region on the other principal surface side of the stacked body 13 and disposed every other layer such as to oppose the first internal electrode 11a with the piezoelectric layer 12 in between. Here, in the region on the one principal surface side and the region on the other principal surface side in the stacked body 13, for example, the orientations of polarization of the piezoelectric layer 12 in these regions are symmetric to each other so that these regions have different behaviors of expansion or contraction from each other at the time of driving. Usually, the boundary between the region on the one principal surface side and the region on the other principal surface side is located in the center portion in the thickness direction.

The plurality of surface electrodes 15 include: a first surface electrode 15a electrically connected to the first internal electrodes 11a; a second surface electrode 15b electrically connected to the second internal electrodes 11b; and a third surface electrode 15c electrically connected to the third internal electrodes 11c. The surface electrode 15 is disposed on at least one principal surface of the stacked body 13.

Further, a plurality of connecting electrodes 14 are disposed on at least one side face of the stacked body 13, and include: a first connecting electrode 14a which electrically connects the first internal electrodes 11a and the first surface electrode 15a; a second connecting electrode 14b which electrically connects the second internal electrodes 11b and the second surface electrode 15b; and a third connecting electrode 14c which electrically connects the third internal electrodes 11c and the third surface electrode 15c.

Here, in place of the side face electrode, the connecting electrode 14 which electrically connects the surface electrode 15 and the internal electrodes 11 may be a penetration conductor going through the piezoelectric layers 12.

As such, when the piezoelectric element 2 of bimorph structure is employed, the piezoelectric element 2 itself can perform flexural displacement. Thus, for example, in an acoustic generation element constructed such that the piezoelectric element is joined to a metal plate for the purpose of improvement of the mechanical strength, a decrease in the amount of displacement caused by a mechanical loss in the joining surface is reduced in comparison with the unimorph structure. Thus, the amount of displacement can be improved. Accordingly, for example, when the piezoelectric element 2 is employed as an acoustic generation element utilizing the flexural displacement, the sound pressure can be improved.

Figure 4B:
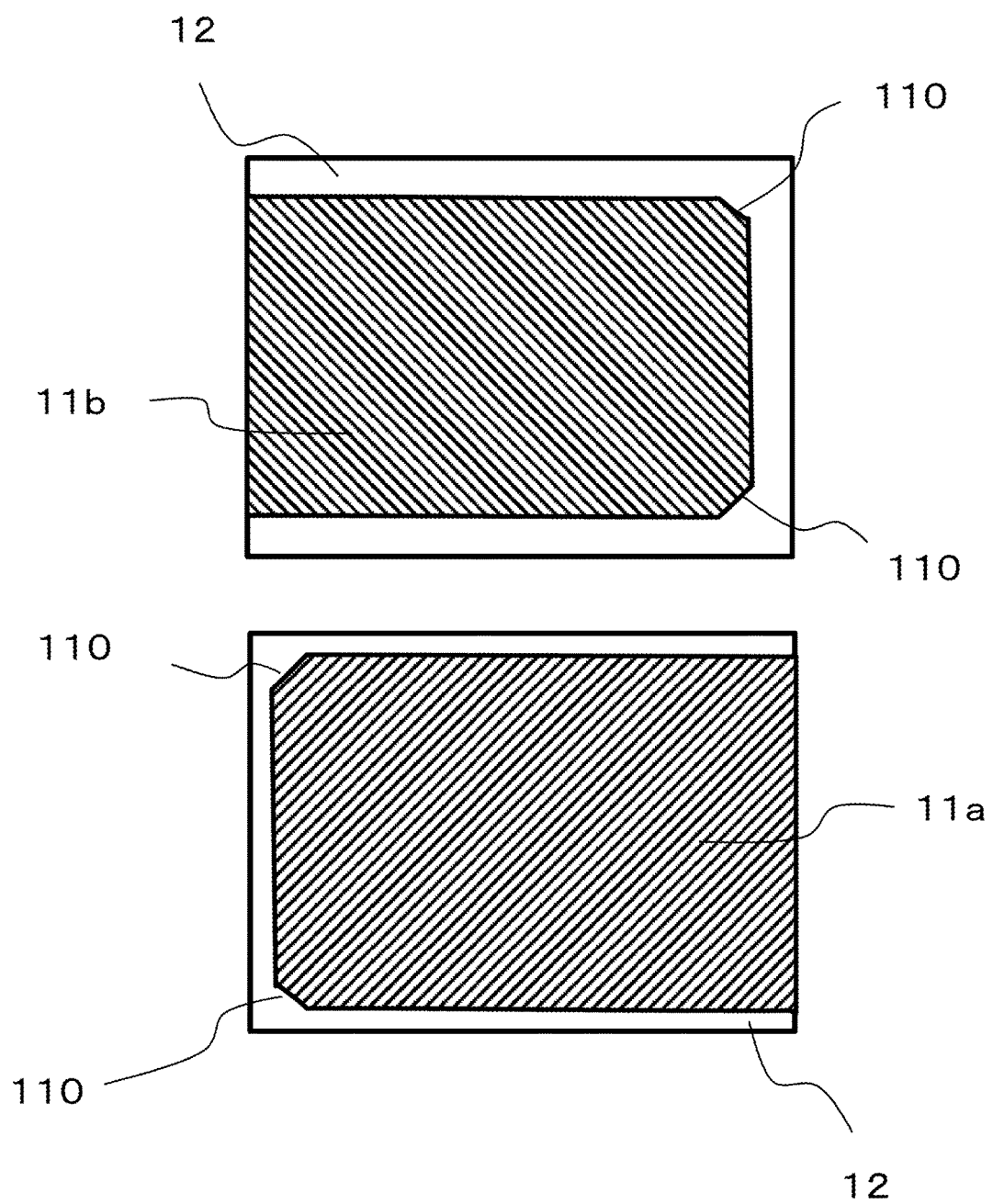
FIG. 4B is a partly-omitted exploded sectional view of still another example of the piezoelectric element of the present embodiment, taken along a plane containing each internal electrode.

Here, as shown in FIG. 4B, the area of the first internal electrode 11a may be larger than the area of the second internal electrode 11b. Here, the first internal electrodes 11a and the second internal electrodes 11b are individually led out to different side faces of the stacked body 13 and the configuration mentioned here indicates that the area of each of the first internal electrodes 11a led out to one side face alone is made larger. According to this configuration, the piezoelectric active region is increased by virtue of an edge effect and hence a high sound pressure can be ensured when the piezoelectric element 2 is employed as an acoustic generator.

Further, in this case, it is preferable that at least one first internal electrode 11a among the plurality of first internal electrodes 11a has a chamfered corner portion whose size is different from sizes of chamfered corner portions of the other first internal electrodes 11a. Here, for example, it is preferable that the distance of the chamfered corner portion 1102 having a size different from those of the other corner portions 1101 (the distance between the virtual corner point having been present before chamfering and the start point of chamfering) is set to be 1.1 to 1.5 times the distance of each of the other corner portions 1101. Since the sizes of chamfering are made different from each other in the internal electrodes 11a having larger active regions, spurious vibration easily occurs so that the effect of peak/dip suppression is enhanced.

Further, the conductor layer 16 is disposed individually between the chamfered corner portion of the first internal electrode 11a and the edge portion 130 in the stacking direction of the stacked body 13 close to the corner portion. Then, it is preferable that the area of at least one conductor layer 162 among the plurality of conductor layers 16 is larger than the area of each of the other conductor layers 161. Here, for example, the distance from the edge portion 130 of the conductor layer 162 having a size different from those of the other conductor layers 161 is set to be 1.1 to 1.5 times the distance of each of the other conductor layers 16. Since the sizes of chamfering are made different from each other in the internal electrodes 11a having larger active regions, spurious vibration easily occurs so that the effect of peak/dip suppression is enhanced and the effect of suppressing the piezoelectric property fluctuation is also enhanced.

Next, a method of manufacturing the piezoelectric elements 1 and 2 of the embodiment given above is described below.

First, a ceramic green sheet used for constructing the piezoelectric layer 12 is prepared. Specifically, calcined powder of piezoelectric ceramics, a binder composed of an acryl-based, butyral-based, or the like organic polymer, and a plasticizer are mixed together so that ceramic slurry is prepared. Then, by using a tape forming method such as a doctor blade method and a calender roll method, a ceramic green sheet is prepared using the ceramic slurry. The piezoelectric ceramics may be an arbitrary one as long as it has a piezoelectric property. For example, a perovskite type oxide composed of lead zirconate titanate ($PbZrO_3$—$PbTiO_3$) may be employed. Further, as the plasticizer, dibutyl phthalate (DBP), dioctyl phthalate (DOP), or the like may be employed.

Next, an electrically conductive paste used for constructing the internal electrodes 11 and the conductor layers 16 is prepared. Specifically, a binder and a plasticizer are added and mixed to metal powder of silver-palladium so that an electrically conductive paste is prepared. This electrically conductive paste is applied onto the above-mentioned ceramic green sheet in a desired pattern for the internal electrode 11 and the conductor layer 16 by screen printing.

At that time, when the electrically conductive paste used for constructing the internal electrode 11 is applied in a chamfered pattern by screen printing, the corner portions 110 located in the other ends of the internal electrode 11 are made into chamfered shapes.

Then, a plurality of ceramic green sheets on which the electrically conductive paste has been printed are stacked. Then, de-binder processing is performed at a predetermined temperature and then firing is performed at a temperature of 900° C. to 1200° C. After that, grinding into a predetermined shape is performed by using a surface grinding machine or the like and thereby the stacked body 13 in which the internal electrodes 11 and the piezoelectric layers 12 are alternately laminated is manufactured.

Here, when the edge portions 130 of the stacked body 13 are to be chamfered, it is sufficient that inclined faces (C faces) or curved faces (R faces) are formed in the corner portions by using a grinding machine. Alternatively, the stacked body may be put in a ball mill together with media, abrasive grains, and a solvent so that the chamfered portions may be formed by rotational grinding.

The employed stacked body 13 is not limited to those obtained by the above-mentioned manufacturing method and may be manufacured by an arbitrary manufacturing method as long as a stacked body in which the plurality of internal electrodes 11 and piezoelectric layers 12 are laminated can be obtained.

After that, a binder, a plasticizer, and a solvent are added to a mixture obtained such that electric conduction particles composed mainly of silver are mixed with glass, and thereby a silver-glass containing electrically conductive paste is prepared. Then, the obtained paste is printed on the principal surfaces and the side faces of the stacked body 13 by screen printing or the like and then drying is performed. After that, firing is performed at a temperature of 600° C. to 800° C. so that the surface electrode 15 and the connecting electrode 14 (the side face electrode) are formed.

Here, in place of the side face electrode formed on the side face of the stacked body 13 as described above, the connecting electrode 14 which electrically connects the surface electrode 15 and the internal electrodes 11 may be a penetration conductor going through the piezoelectric layers 12.

After that, polarization processing is performed on the stacked body 13 so that piezoelectric activity is imparted. For the polarization processing, a direct-current power supply is employed, then, for example, in case of the piezoelectric element 1 of unimorph structure as shown in FIG. 1, the first surface electrode 15a is connected to the negative electrode and the second surface electrode 15b is connected to the positive electrode, and then, for example, a potential difference of 2 to 3 kV/mm is applied at an ambient temperature of 15° C. to 35° C. for several seconds as an application time. The voltage, the ambient temperature, and the application time are suitably selected depending on the property of the piezoelectric material.

On the other hand, in case of the piezoelectric element 2 of bimorph structure as shown in FIG. 6, similarly, polarization processing is performed so that a direct-current power supply is employed and then, for example, the first surface electrode 15a is connected to the ground pole, the second surface electrode 15b is connected to the positive electrode, and the third surface electrode 15c is connected to the negative electrode.

A desired piezoelectric element can be obtained as described above. However, when a power feeding member is required, it may be arranged in the piezoelectric element 1 or 2 by the following methods. For example, in a case where a flexible wiring board is to be connected and fixed (joined) to the piezoelectric element 1 or 2 by using electrically conductive adhesives, a paste for electrically conductive adhesives is applied and formed at a predetermined position of the piezoelectric element 1 or 2 by using a technique such as screen printing. After that, the paste for electrically conductive adhesives is cured in a state where the flexible wiring board abuts against the piezoelectric element, so that the flexible wiring board is connected and fixed to the piezoelectric element 1 or 2. Here, the paste for electrically conductive adhesives may be applied and formed on the flexible wiring board side.

Here, a lead wire provided with an insulating cover may be employed as the power feeding member and solder may be employed as the joining member. As such, any member having a similar function may suitably be selected.

Next, an example of an acoustic generator of the present embodiment is described below.

Figure 7:
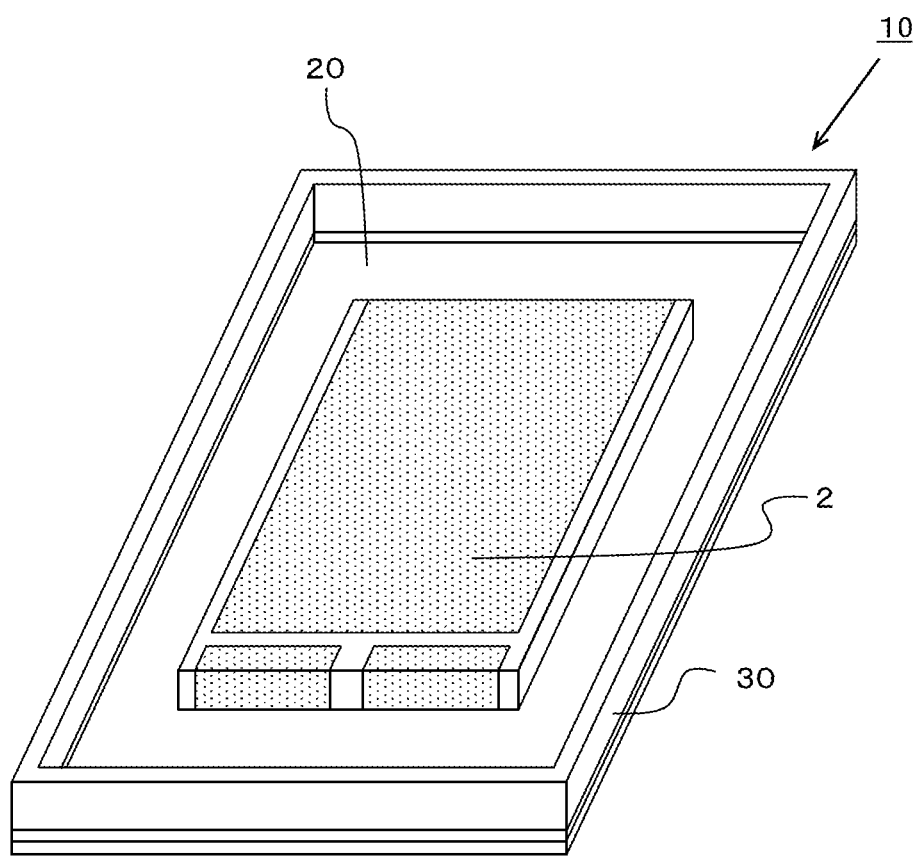
FIG. 7 is a schematic perspective view showing an example of an acoustic generator of the present embodiment.
Figure 8:
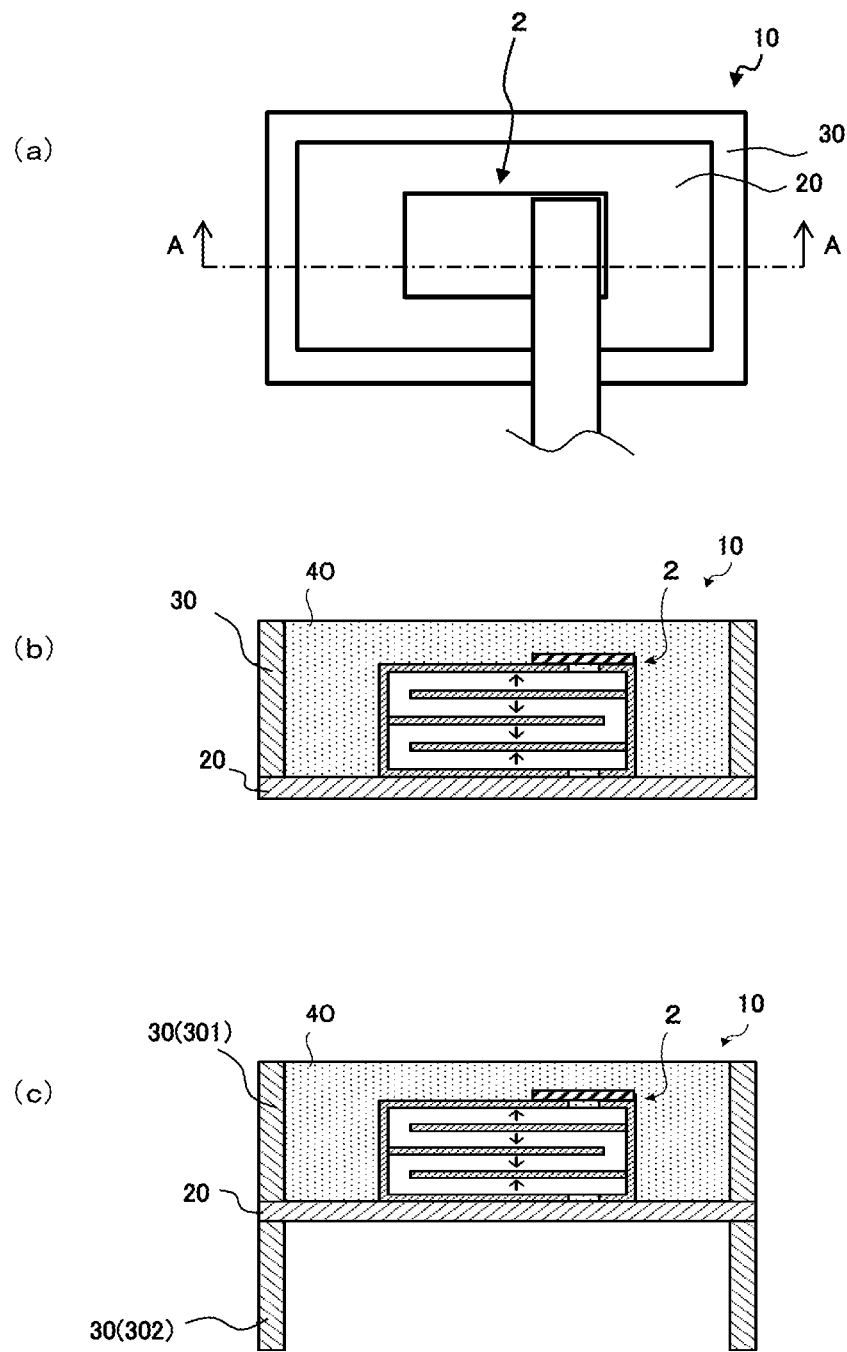
FIG. 8(a) is a schematic plan view showing a schematic configuration of an acoustic generator of the present embodiment.
FIG. 8(b) is a schematic sectional view of an example taken along line A-A in FIG. 8(a)
FIG. 8(c) is a schematic sectional view of another example taken along line A-A in FIG. 8(a)

As shown in FIGS. 7 and 8, the acoustic generator 10 of the present embodiment includes: the piezoelectric element 2 described above; a vibration plate 20 to which the piezoelectric element 2 is attached and which vibrates in association with the vibration of the piezoelectric element 2; and a frame 30 disposed in at least a part of the outer periphery of the vibration plate 20 and serving as a supporting body which supports the vibration plate 20. Here, in the present example, description is given for the piezoelectric element 2. However, similar description holds also for the piezoelectric element 1.

The piezoelectric element 2 is an exciter which vibrates in response to an applied voltage so as to excite the vibration plate 20. The principal surface of the piezoelectric element 2 and the principal surface of the vibration plate 20 are joined together by adhesives such as epoxy-based resin. Then, when the piezoelectric element 2 performs flexural vibration, the piezoelectric element 2 imparts predetermined vibration to the vibration plate 20 so that sound is generated.

The peripheral edge portion of the vibration plate 20 is fixed to the frame 30 in a state where a tension is acting. Then, the vibration plate 20 vibrates together with the piezoelectric element 2 in association with the vibration of the piezoelectric element 2. The vibration plate 20 may be formed using various materials such as resin and metal. For example, the vibration plate 20 may be manufactured from a resin film such as polyethylene, polyimide, and polypropylene having a thickness of 10 to 200 μm. When the vibration plate 20 is manufactured from a resin film, the vibration plate 20 can perform flexural vibration with a large amplitude and then the width and the height of the resonance peak in the frequency characteristics of the sound pressure can be widened and lowered respectively so that the difference between the resonance peak and dip can be reduced. However, the vibration plate 20 is not limited to a resin film and may be a resin plate, a metal plate, a glass plate, or the like. Alternatively, for example, a part of the housing or a part of the display of an electronic apparatus such as a portable terminal may serve as the vibration plate 20.

The frame 30 serves as a supporting body which supports the outer periphery of the principal surface of the vibration plate 20. When the outer periphery of the vibration plate 20 is supported by the frame 30 so that a vibration space is provided, the amplitude of the vibration plate 20 can be increased and hence the sound pressure can be improved. For example, the frame may be formed using various materials like metal such as stainless steel, glass, an acrylic resin, a polycarbonate resin, and a polybutylene terephthalate resin.

The frame 30 is joined to one principal surface or the other principal surface of the vibration plate 20 with a joining material in between. The joining material may be: resin-based adhesives; a viscoelastic material formed in a sheet; a member in which a base material layer and a viscoelastic material layer are stacked; or the like. Then, the materials for these may be: acryl-based, epoxy-based, or the like adhesives; and rubber-based, acryl-based, silicone-based, urethane-based, or the like pressure sensitive adhesives. Further, the base material layer may be composed of acetate form, acrylic foam, cellophane, polyethylene foam, paper, or nonwoven fabric.

Like in the example shown in FIGS. 7 and 8, when the frame 30 is joined to the principal surface to which the piezoelectric element 2 of the vibration plate 20 has been joined, the piezoelectric element 2 can be protected by the frame 30 especially in a case where the total thickness of the frame 30 and the joining material is greater than the thickness of the piezoelectric element 2.

The frame 30 may be composed of a single frame member (an upper frame member 301) as shown in FIG. 8(b) or, alternatively, may be composed of two frame members (the upper frame member 301 and a lower frame member 302) as shown in FIG. 8(c). In this case, since the vibration plate 20 is located between the two frame members, the tension of the vibration plate 20 can be stabilized. Here, the thickness of each of the upper frame member 301 and the lower frame member 302 is set to be 100 to 5000 μm.

As shown in FIGS. 8(b) and 8(c), the acoustic generator 10 of the present embodiment may further include a resin layer 40 disposed such as to cover from the piezoelectric actuator 1 to at least a part of the surface of the vibration plate 20 (e.g., a peripheral part of the piezoelectric actuator 1). For example, the resin layer 40 is formed such that the Young's modulus falls within a range from 1 MPa to 1 GPa, and is formed of an acrylic resin or the like. When the piezoelectric actuator 1 (the piezoelectric element 1) is buried in the resin layer 40, a suitable damper effect can be induced so that the resonance phenomena can be suppressed and the peak and the dip in the frequency characteristics of the sound pressure can be suppressed small. Here, as shown in FIGS. 8(b) and 8(c), the resin layer 40 may be formed in the same height as the upper frame member 301.

The acoustic generator 10 of the present embodiment is constructed from the piezoelectric element 2 in which even in long term use at a high voltage, dielectric breakdown or breakage is less prone to occur and a fluctuation in the electrical characteristics is suppressed. Thus, size reduction is achieved and a high sound pressure and a high reliability are obtained.

Next, an example of an acoustic generation device of the present embodiment is described below.

Figure 9:
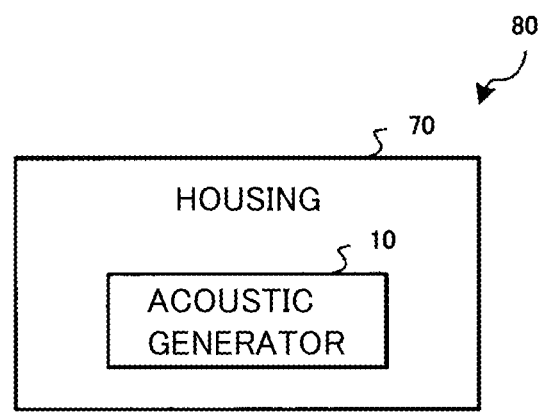
FIG. 9 is a diagram showing a configuration of an acoustic generation device of the present embodiment.

The acoustic generation device is a sound generation device such as a so-called speaker. As shown in FIG. 9, the acoustic generation device 80 of the present embodiment includes: the acoustic generator 10; and a housing 70 which containsh the acoustic generator 10. Here, a part of the housing 70 may serve as the vibration plate 20 constituting the acoustic generator 10. Further, the expression "the housing 70 contains the acoustic generator 10" includes a situation where a part of the acoustic generator 10 (the piezoelectric element 1) is contained.

The housing 70 causes the acoustic sound generated by the acoustic generator 10 to resonate in an inside thereof, and then radiates the acoustic sound to an outside thereof through an opening (not shown) formed in the housing 70. When the housing having such a configuration is provided, for example, the sound pressure in a low frequency band can be increased.

The acoustic generation device 80 may be employed as a speaker in a stand-alone manner. In addition, as described later, the acoustic generation device 80 may be suitably incorporated into a portable terminal, a flat panel TV, a tablet terminal, or the like. Further, the acoustic generation device 80 may suitably be incorporated into home electronics such as a refrigerator, a microwave oven, a vacuum cleaner, and a washing machine in which the sound quality is not recognized as important in the conventional art.

The acoustic generation device 80 of the present embodiment described above is constructed from the acoustic generator 10 employing the piezoelectric element 2 in which even in long term use at a high voltage, dielectric breakdown or breakage is less prone to occur and a fluctuation in the electrical characteristics is suppressed. Thus, size reduction is achieved, and a high sound pressure and a high reliability are obtained.

Next, an example of an electronic apparatus of the present embodiment is described below.

Figure 10:
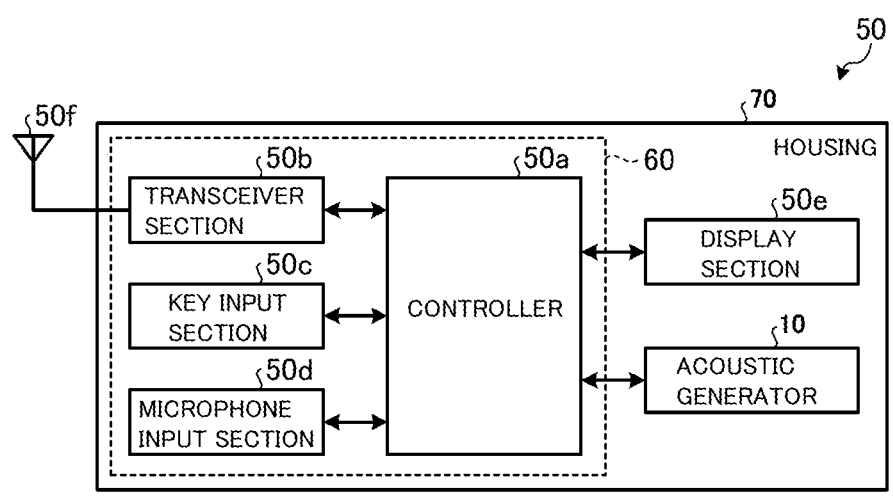
FIG. 10 is a diagram showing a configuration of an electronic apparatus of the present embodiment.

As shown in FIG. 10, the electronic apparatus 50 of the present embodiment includes: the acoustic generator 10; an electronic circuit 60 connected to the acoustic generator 10; and the housing 70 which contains the electronic circuit 60 and the acoustic generator 10. Then, the electronic apparatus 50 has a function of generating acoustic sound through the acoustic generator 10.

The electronic apparatus 50 includes the electronic circuit 60. For example, the electronic circuit 60 is constructed from a controller 50a, a transceiver section 50b, a key input section 50c, and a microphone input section 50d. The electronic circuit 60 is connected to the acoustic generator 10 and has a function of outputting an audio signal to the acoustic generator 10. On the basis of the audio signal inputted from the electronic circuit 60, the acoustic generator 10 generates acoustic sound.

Further, the electronic apparatus 50 includes a display section 50e, an antenna 50f, and the acoustic generator 10 and further includes the housing 70 which contains these devices. Here, FIG. 10 shows a configuration that all devices such as the controller 50a are contained in the housing 70 of single construction. However, employable configurations of containing are not limited to this. In the present embodiment, it is sufficient that at least the electronic circuit 60 and the acoustic generator 10 are contained in the housing 70 of single construction.

The controller 50a is a control section of the electronic apparatus 50. On the basis of the control of the controller 50a, the transceiver section 50b performs transmission and reception of data or the like through the antenna 50f. The key input section 50c is an input device of the electronic apparatus 50 and receives key input operation performed by an operator. The microphone input section 50d is similarly an input device of the electronic apparatus 50 and receives voice input operation or the like performed by the operator. The display section 50e is a display output device of the electronic apparatus 50 and outputs display information on the basis of the control of the controller 50a.

Then, the acoustic generator 10 serves as an acoustic output device in the electronic apparatus 50. Here, the acoustic generator 10 is connected to the controller 50a of the electronic circuit 60 and generates acoustic sound in response to a voltage applied under the control of the controller 50a.

Here, in FIG. 10, description has been given for a case where the electronic apparatus 50 is a portable terminal device. However, the type of the electronic apparatus 50 is not limited to this. That is, the electronic apparatus 50 may be applied to various consumer devices having a function of generating acoustic sound. For example, the electronic apparatus 50 may be applied to a flat panel TV and a car audio apparatus as well as to various products having a function of generating acoustic sound like a vacuum cleaner, a washing machine, a refrigerator, and a microwave oven.

The electronic apparatus of the present embodiment described above is constructed from the acoustic generator 10 employing the piezoelectric element 2 in which even in long term use at a high voltage, dielectric breakdown or breakage is less prone to occur and a fluctuation in the electrical characteristics is suppressed. Thus, size reduction is achieved and a high sound pressure and a high reliability are obtained.

EXAMPLES

Specific examples of the piezoelectric element and the acoustic generator of the invention are described below. Specifically, piezoelectric elements and acoustic generators according to the embodiments shown in FIGS. 1 and 4 and according to a comparative example were produced as follows.

Each piezoelectric element was in a rectangular parallelepiped shape having a length of 35 mm, a width of 15 mm, and a thickness of 0.22 mm. Further, the piezoelectric element had a structure that piezoelectric layers having a thickness of 20 µm and internal electrodes were alternately laminated. The total number of piezoelectric layers were eight. The piezoelectric layers were formed from lead zirconate titanate. The internal electrodes were formed of silver-palladium.

Here, the internal electrode in the piezoelectric element of the embodiment shown in FIG. 1 was constructed such that the length was 34 mm, the width was 14 mm, and the distances of corner chamfering (the chamfering distance of the C faces) were 3 mm and 3 mm. Further, in the internal electrode in the piezoelectric element of the embodiment shown in FIG. 4A, the length was 34 mm, the width was 14 mm, the distances of corner chamfering (the chamfering distance of the C faces) were 3 mm and 3 mm, and then a conductor layer was constructed from a conductor of the same construction material as the internal electrode and located in each corner portion of the stacked body with an interval of 0.5 mm in between in parallel to the chamfered surface (the C face). Further, the internal electrode in the piezoelectric element of a comparative example was constructed such that the length was 34 mm, the width was 14 mm, and the corner portions were not chamfered.

Each internal electrode having the above-mentioned configuration was printed by using an electrically conductive paste composed of silver palladium onto a ceramic green sheet. Then, ceramic green sheets were stacked and then pressured into close contact with each other. After that, degreasing was performed at a predetermined temperature and then firing was performed at 1000° C. so that a sintered compact stacked body was obtained.

Then, the surface electrodes and the end face electrodes were printed and formed by using a silver paste and then baking was performed at 750° C.

After that, a voltage having an electric field strength of 2 kV/mm was applied so that polarization was imparted to such a piezoelectric element.

Then, a supporting body provided with a vibration plate was prepared that was constructed such that a polyethylene terephthalate film having a length of 50 mm and a width of 25 mm was joined with adhesives to a supporting body formed of SUS and having an outer length of 50 mm, an outer width of 25 mm, an inner length of 46 mm, and an inner width of 21 mm. Then, the above-mentioned piezoelectric element was bonded onto the principal surface of the vibration plate with acrylic adhesives.

Then, an electrically conductive adhesive containing gold-plated resin balls serving as electric conduction particles was applied and formed onto the surface of the piezoelectric element to be joined to a flexible wiring board. Then, in a state where the flexible wiring board abuts against the piezoelectric element, heating and pressing were performed so that the flexible wiring board was fixed to the piezoelectric element in a state where electrical conductance was established. As a result, acoustic generators Nos. 1, 2, and 3 were obtained that have employed respectively the piezoelectric elements of the implementation examples and the comparative example of the invention. Here, the acoustic generator No. 1 has employed the piezoelectric element of FIG. 1 of the invention, the acoustic generator No. 2 has employed the piezoelectric element of FIG. 4A of the invention, and the acoustic generator No. 3 has employed the piezoelectric element of the comparative example.

In each acoustic generator, a rectangular wave signal of 0 to 20 V at a frequency of 1 kHz was applied through the flexible wiring board onto the piezoelectric element so that a drive test was performed. Then, in the samples Nos. 1 and 2, no change in the sound pressure at 1 kHz was recognized before and after the test. In contrast, in the sample No. 3, an abnormal drop in the sound pressure was recognized and cracks were found in that inspection of the piezoelectric element.

It has been confirmed that in the piezoelectric element of the present embodiment, even in long term driving at a high voltage, breakage is less prone to occur and a fluctuation in the electrical characteristics is suppressed.

REFERENCE SIGNS LIST

1, 2: Piezoelectric element
11: Internal electrode
11a: First internal electrode
11b, 11b1, 11b2: Second internal electrode
11c: Third internal electrode
110, 1101, 1102: Corner portion
12: Piezoelectric layer
13: Stacked body
130: Edge portion
14: Connecting electrode
14a: First connecting electrode
14b: Second connecting electrode
14c: Third connecting electrode
15: Surface electrode
15a: First surface electrode
15b: Second surface electrode
15c: Third surface electrode
16, 161, 162: Conductor layer
10: Acoustic generator
20: Vibration plate
30: Frame
301: Upper frame member
302: Lower frame member
50: Electronic apparatus
50a: Controller
50b: Transceiver section
50c: Key input section
50d: Microphone input section
50e: Display section
50f: Antenna
60: Electronic circuit
70: Housing
80: Acoustic generation device

The invention claimed is:

1. A piezoelectric element, comprising:
a stacked body in which a plurality of internal electrodes and piezoelectric layers are laminated, the stacked body having a rectangular shape in a plan view thereof; and
a plurality of connecting electrodes connected to one ends of the plurality of internal electrodes, respectively,
corner portions of the other ends of the plurality of internal electrodes being chamfered, and
wherein the internal electrode provided with the chamfered corner portions is disposed between the piezoelectric layers, and conductor layers are disposed between the chamfered corner portions and edge portions of the stacked body close to the chamfered corner portions.

2. The piezoelectric element according to claim 1, wherein at least one internal electrode among the plurality of internal electrodes has a chamfered corner portion whose size is different from sizes of chamfered corner portions of the other internal electrodes.

3. The piezoelectric element according to claim 1, wherein edge portions of the stacked body close to the chamfered corner portions are chamfered.

4. The piezoelectric element according to claim 1, wherein at least one conductor layer among the conductor layers has a larger area than each of the other conductor layers.

5. The piezoelectric element according to claim 1, wherein the plurality of internal electrodes include first internal electrodes and second internal electrodes which are alternately arranged along a stacking direction thereof, and
an area of each of the first internal electrodes is larger than an area of each of the second internal electrodes.

6. The piezoelectric element according to claim 5, wherein at least one first internal electrode among the plurality of first internal electrodes has a chamfered corner portion whose size is different from sizes of chamfered corner portions of the other first internal electrodes.

7. The piezoelectric element according to claim 5, wherein conductor layers are disposed between the chamfered corner portions of the first internal electrodes and edge portions of the stacked body close to the chamfered corner portions, and
the area of at least one conductor layer among the conductor layers is larger than the area of each of the other conductor layers.

8. An acoustic generator, comprising:
the piezoelectric element according to claim 1;
a vibration plate to which the piezoelectric element is attached, the vibration plate vibrating in association with vibration of the piezoelectric element; and
a supporting body disposed in at least a part of an outer periphery of the vibration plate so as to support the vibration plate.

9. An acoustic generation device, comprising:
the acoustic generator according to claim 8; and
a housing which contains the acoustic generator.

10. An electronic apparatus, comprising:
the acoustic generator according to claim 8;
an electronic circuit connected to the acoustic generator; and
a housing which contains the electronic circuit and the acoustic generator,
the electronic apparatus having a function of generating acoustic sound through the acoustic generator.

11. A piezoelectric element, comprising:
a stacked body in which a plurality of internal electrodes and piezoelectric layers are laminated, the stacked body having a rectangular shape in a plan view thereof; and
a plurality of connecting electrodes connected to one ends of the plurality of internal electrodes, respectively,
corner portions of the other ends of the plurality of internal electrodes being chamfered,
wherein the plurality of internal electrodes include first internal electrodes and second internal electrodes which are alternately arranged along a stacking direction thereof,
an area of each of the first internal electrodes is larger than an area of each of the second internal electrodes,
wherein conductor layers are disposed between the chamfered corner portions of the first internal electrodes and edge portions of the stacked body close to the chamfered corner portions, and
the area of at least one conductor layer among the conductor layers is larger than the area of each of the other conductor layers.

* * * * *